United States Patent [19]
Cranford, Jr. et al.

[11] Patent Number: 5,940,441
[45] Date of Patent: Aug. 17, 1999

[54] INTEGRATED ADAPTIVE CABLE EQUALIZER USING A CONTINUOUS-TIME FILTER

[75] Inventors: Hayden Clay Cranford, Jr., Apex; Scott David Huss, Raleigh, both of N.C.

[73] Assignee: International Business Machines Corporation, Armonk, N.Y.

[21] Appl. No.: 08/739,391

[22] Filed: Oct. 29, 1996

[51] Int. Cl.[6] .............................. H03H 7/30; H03H 7/40; H03K 5/159
[52] U.S. Cl. .......................... 375/232; 333/18; 333/28 R
[58] Field of Search .................... 375/229, 232, 375/233, 285, 257, 344, 345, 346, 350, 377; 364/724.2, 724.011, 724.19; 333/18, 28 R

[56] References Cited

U.S. PATENT DOCUMENTS

| | | | |
|---|---|---|---|
| 4,219,842 | 8/1980 | Miller | 358/31 |
| 4,415,872 | 11/1983 | Karabinis . | |
| 4,707,840 | 11/1987 | Nakayama . | |
| 4,789,952 | 12/1988 | Lo et al. . | |
| 4,802,222 | 1/1989 | Weaver | 381/35 |
| 4,885,757 | 12/1989 | Provence | 375/96 |
| 4,995,057 | 2/1991 | Chung | 375/13 |
| 5,243,624 | 9/1993 | Paik et al. . | |
| 5,311,545 | 5/1994 | Critchlow | 375/14 |
| 5,323,423 | 6/1994 | Townsend et al. | 375/14 |
| 5,375,145 | 12/1994 | Abbott et al. . | |
| 5,392,171 | 2/1995 | Kovner et al. | 360/65 |
| 5,434,883 | 7/1995 | Kimoto et al. . | |
| 5,455,843 | 10/1995 | Cherubini et al. . | |
| 5,525,928 | 6/1996 | Asakawa | 327/552 |
| 5,585,758 | 12/1996 | Prines et al. | 327/438 |
| 5,621,355 | 4/1997 | Williams et al. | 330/107 |
| 5,671,252 | 9/1997 | Kovacs et al. | 375/316 |
| 5,706,314 | 1/1998 | Davis et al. | 375/340 |

*Primary Examiner*—Jason Chan
*Assistant Examiner*—Jean B Corrielus
*Attorney, Agent, or Firm*—Joscelyn G. Cockburn; Winstead, Sechrest & Minick, PC

[57] ABSTRACT

A method and apparatus for equalizing a communications signal transmitted through a transmission medium includes an integrated continuous-time filter and circuitry for developing a feedback signal to compensate for distortion in the signal caused by the transmission medium. The control signal adjusts the transfer characteristics of the integrated continuous-time filter thereby compensating for loss and distortion of the signal caused by the transmission medium and further tunes the integrated continuous-time filter thereby compensating for semiconductor process variations in the integrated continuous-time filter.

28 Claims, 7 Drawing Sheets

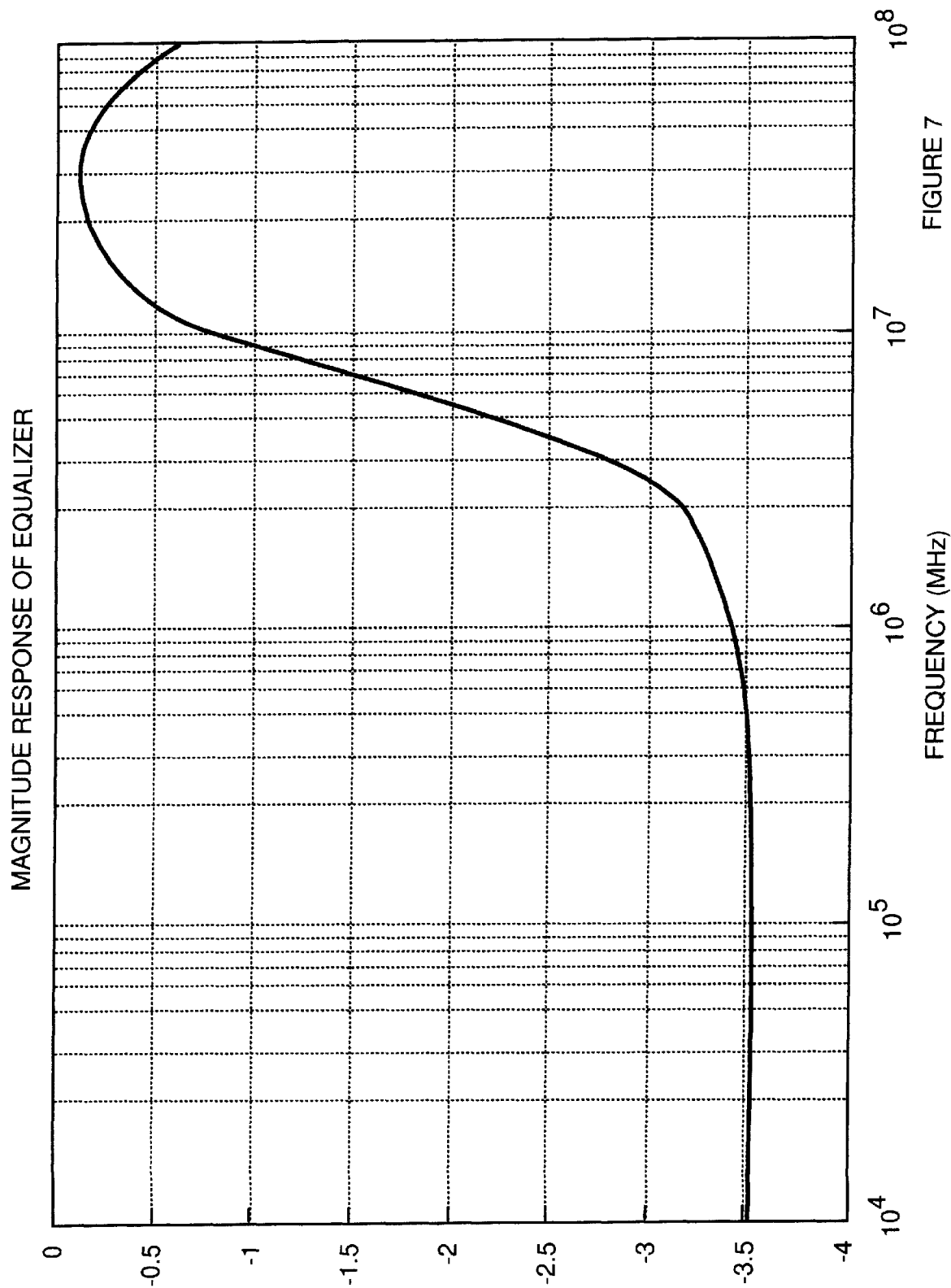

INTEGRATED ADAPTIVE CABLE EQUALIZER USING A CONTINUOUS-TIME FILTER

TECHNICAL FIELD OF THE INVENTION

The present invention relates to adaptive cable equalizers and, in particular, to an integrated adaptive cable equalizer utilizing a continuous-time filter.

BACKGROUND OF THE INVENTION

With the substantial increases in both digital (and analog) communications and communications networks, the effects (i.e., attenuation, frequency variations, etc.) of the interconnection cabling (i.e., twisted pair, coaxial, etc.) on the communications signals is becoming ever important. Communications channels typically consist of one-way channels, two-way channels, or may comprise communication network(s) such as wide area networks (WANs), metropolitan area networks (MANs), or local area networks (LANs). Such networks may include token ring systems, ethernet communications, etc. The communications channel or link typically comprises one or more cables. Transmission of the communications signal over a cable (i.e., transmission medium) typically causes distortion of the signal. This distortion generally occurs as attenuation and frequency variations in the signal which are caused by cable length, temperature, interconnection loss, etc.

In order to correct for the distortion, "equalizers" have been designed and incorporated into the receiving end of the communications channel to "equalize" the signal. For equalization, in some applications, a compromise fixed equalizer is employed to compensate the channel in cables and magnetic storage channels. The performance of a compromise fixed equalizer degrades at short and long cable lengths since it is generally optimized for a medium cable length. For magnetic read channels, the performance of a compromise fixed equalizer degrades with fluctuations in the read channel.

Other equalization methods use an adaptive algorithm to automatically adjust the equalizer to compensate for the distortion caused by the cable (communications channel), and include both fixed and variable components. These methods generally require, in some fashion, tuning of the fixed components of the equalizer to compensate for process variations. Such algorithms adjust the variable components to compensate for the channel variations and process variations. Another implementation uses off-chip resistors and capacitors for the fixed components and off-chip PIN diodes for the variable components. The problem with such an implementation is that it is expensive and requires a large amount of area. Another solution uses an adaptive algorithm to tune several poles and zeros of the equalizer separately. However, this requires complex circuitry to calculate gradients, and often will not converge to the optimal solution unless training is used. Still another implementation uses a multiple-loop-feedback method to realize a general purpose analog filter function that can be designed to operate as an equalizer which has a gain that increases with frequency. This type of equalizer requires multiple parameters to adjust, and it also requires a separate variable gain amplifier (VGA). In addition, it also requires fixed components that will vary with the manufacturing process, thus requiring a tuning mechanism to compensate for process tolerances.

Accordingly, there exists a need for a cable equalizer that compensates for variations in the communications signal caused by distortion in the cable and further compensates for the relatively large process tolerances of the components on an integrated circuit. Further, there is needed an adaptive cable equalizer comprising an integrated continuous-time filter for adaptively compensating for cable variations and semiconductor process variations. Also, there is needed a simple and relatively inexpensive control system to adapt the integrated equalizer without training. Such an implementation can be implemented in standard CMOS technology and will also eliminate the need for a variable gain amplifier (VGA) circuit. There is also needed an adaptive equalizer which does not require accurate fixed components that would require tuning. In addition, there exists a need for a high-order integrated adaptive cable equalizer that performs higher order filter functions and that utilizes at most two control parameters.

SUMMARY OF THE INVENTION

According to the present invention, there is provided an adaptive equalizer including an integrated continuous-time filter fabricated on a substrate for receiving and filtering an input signal from a cable and generating an output signal, the output signal being an equalized version of the input signal. The equalizer further processes the output signal and generates a control signal for feedback to the integrated continuous-time filter. The control signal controls transfer characteristics of the integrated continuous-time filter such that distortion in the input signal from the cable and semiconductor process variations in the integrated continuous-time filter are compensated.

In accordance with the present invention, there is provided an apparatus including an integrated continuous-time filter fabricated on a substrate for receiving and filtering an input signal from a cable and generating an output signal, the output signal being an equalized version of the input signal. The apparatus also includes circuitry, coupled to the integrated continuous-time filter in a feedback loop, for processing the output signal and generating a gain control signal and a bandwidth control signal for feedback to the integrated continuous-time filter. The gain control signal and the bandwidth control signal adjust the transfer characteristics of the integrated continuous-time filter thereby compensating for loss and distortion of the input signal caused by the cable and tuning the integrated continuous-time filter to compensate for semiconductor process variations in the integrated continuous-time filter.

In accordance with the present invention, there is provided a method for compensating for distortion of a signal caused by the transmission of the signal through a transmission medium. The method includes the step of receiving the signal and performing an adaptive algorithm on the received signal using one or more known parameters of the received signal A control signal is generated in response to the performance of the adaptive algorithm that is fed back to an integrated continuous-time filter. The received signal is filtered with the integrated continuous-time filter to generate an equalized signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is made to the following description taken in conjunction with the accompanying drawings, wherein:

FIG. 7 illustrates a frequency response of the equalizer shown in FIG. 4, for $p_1=7.2$ MHz, $p_2=230$ MHz, and $z_1=4.8$ MHz.

DETAILED DESCRIPTION OF THE INVENTION

Figure 1:
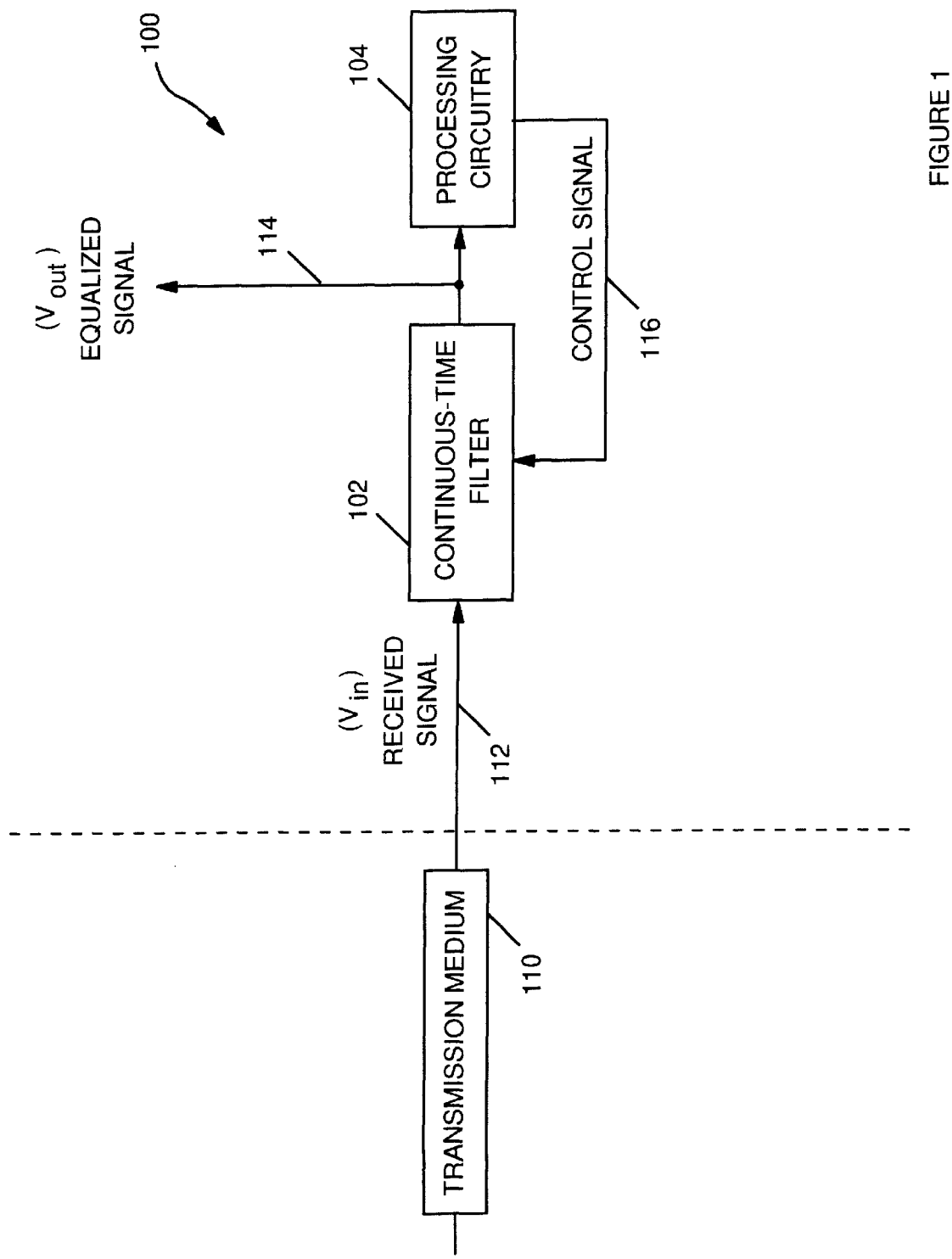
FIG. 1 illustrates an adaptive cable equalizer in accordance with the present invention.

With reference to the drawings, like reference characters designate like or similar parts throughout the drawings.

Now referring to FIG. 1, there is illustrated a block diagram of an adaptive cable equalizer 100 in accordance with the present invention. The adaptive cable 100 includes two major components—a continuous-time filter 102 and processing circuitry 104. The adaptive cable equalizer 100 receives a signal 112 transmitted over a transmission medium 110 (i.e., a cable). As will be appreciated, the normal operation of transmitting the signal 112 through the transmission medium 110 (sometimes referred to as the channel) causes distortion in the received signal 112. This distortion includes attenuation of the signal 112 as well as distortion in the frequency response of the signal 112, and is effectuated by the length of the transmission line, any included connectors, temperature, etc. The characteristics of the channel may vary at any given time.

The adaptive cable equalizer 100 receives the signal 112 from the transmission medium 110 and "equalizes" the signal 112, thereby generating the equalized signal 114. This "equalization" compensates for the distortion in the signal 112 caused by the transmission medium 110, including distortion caused by environmental effects on the transmission medium 110. The continuous-time filter 102 outputs the equalized signal 114 which is also input to the processing circuitry 104. The processing circuitry 104 operates on the equalized signal 114 in a closed loop feedback fashion to generate the control signal 116. The control signal 116 "tunes" or adjusts the transfer characteristic(s) of the continuous-time filter 102 to provide the desired compensation.

In contrast to continuous-time filters, conventional analog filters are generally composed of discrete elements, including resistors, capacitors and inductors. It is well-known how to design passive LC networks or active RC circuits to derive a given transfer function. In order to contain costs and reduce complexity, as well as size, techniques have been developed to integrate complex analog filter functions on semiconductor chips. These filters are commonly referred to as integrated continuous-time filters. Integrated continuous-time filters are typically comprised of active elements (e.g., operational amplifiers, operational transconductance amplifiers, transconductors, etc.) and resistors and capacitors, usually configured in an RC feedback network.

In order to provide operation of an integrated filter within the required frequency parameters, very accurate absolute values of resistors, transconductors and capacitors must be realized and maintained. However, integration of such components on a chip produces components having large tolerances. Although integrated circuit (IC) processing reliably realizes accurate ratios of like components on a chip, processing tolerances of absolute values of resistors, capacitors and transistor parameters are generally of the order of 20 to 50 percent. As such, the magnitudes of these tolerances are too large for a filter to perform within specifications. In order to use these relatively inexpensive integrated analog filters, some type of tuning or adjustment mechanism is required to compensate for semiconductor process variations (or tolerances) of the elements of the continuous-time filter. As such, the processing circuitry 104 compensates for both cable distortion (attenuation and frequency response) and variations in the filter characteristics caused by semiconductor process variations.

As described earlier, the processing circuitry 104 processes the signal 114 output from the continuous-time filter 102 and generates a control signal 116. The control signal 116 is fed back to the integrated continuous-time filter 102 and adjusts the transfer characteristics of the integrated continuous-time filter 102 thereby compensating for loss and distortion of the signal 112 caused by the transmission medium 110 and further tuning the integrated continuous-time filter 102 to compensate for semiconductor process variations in the integrated continuous-time filter 102.

Figure 2:
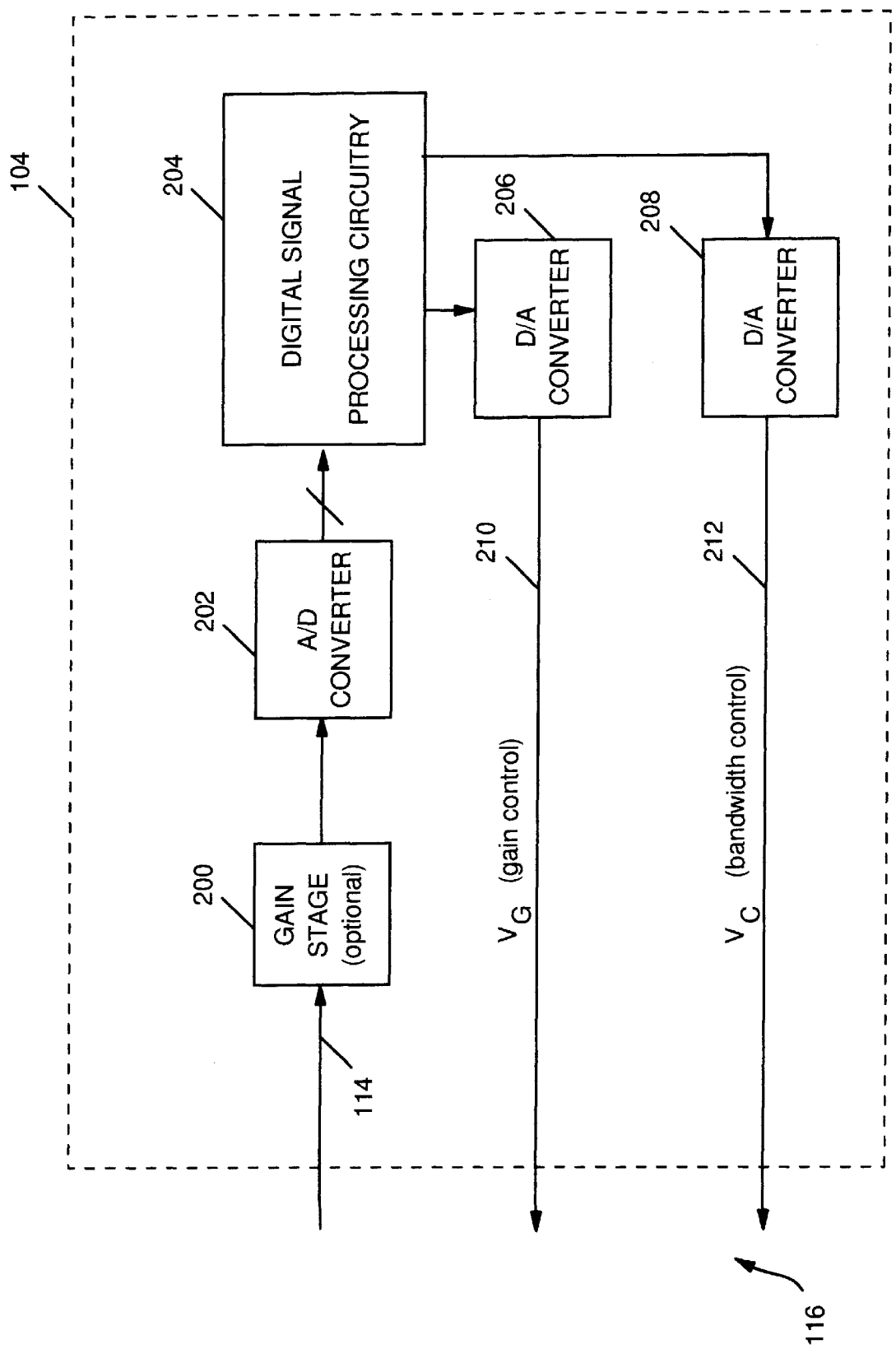
FIG. 2 is a digital implementation of signal processing circuitry shown in FIG. 1.

Now referring to FIG. 2, there is shown a digital implementation of the signal processing circuitry 104 shown in FIG. 1. The signal 114 output from the continuous-time filter 102 is input to an analog-to-digital (A/D) converter 202. An optional gain stage 200 may be included to provide amplification if desired. Accordingly, the digital version of the signal 114 is input to digital signal processing circuitry 204 for processing. The digital signal processing circuitry 204 may include one or more digital filters, a digital signal processor (DSP), and the like, and/or other circuitry for digitally processing the signal 114. It will be understood by those skilled in the art that hardware and/or software may be used to perform the digital signal processing.

Current literature provides several adaptive algorithms for computing/calculating the control signal 116 for optimal equalization. In one embodiment, the digital signal processing circuitry 204 utilizes an adaptive algorithm to generate the control signal 116 by minimizing the autocorrelation of the received signal 114. Autocorrelation refers to the measure of correlation between samples of the signal at different times. Autocorrelation methods and techniques are well known in the art. This method is relatively effective since the autocorrelation is independent of the amplitude of the received signal 114 thus allowing optimization of the gain and frequency response of the transmission medium 110 independently and without any type of training.

The digital signal processing circuitry 204 generates two control parameters for controlling the continuous-time filter 102. One of the parameters controls gain while the other controls the frequency response of the continuous-time filter. The control signal is generated by the digital signal processing circuitry 204 in response to a comparison between frequency and amplitude characteristics of the output signal 114 of the integrated continous-time filter 102 and ideal frequency and amplitude characteristics of the input signal 112. As illustrated in FIG. 2, two digital-to-analog (D/A) converters 206, 208 provide conversion of the two control parameters to analog signals. The D/A converter 206 outputs an analog gain control signal 210 ($V_G$) and the D/A converter 208 outputs an analog bandwidth control signal 212 ($V_C$). As such, the two-parameter equalizer 100 includes the gain control signal 210 for compensation of attenuation and the bandwidth control signal 212 for compensation of bandwidth (frequency response). These parameters adjust the transfer characteristics of the continuous-time filter 102.

Figure 3:
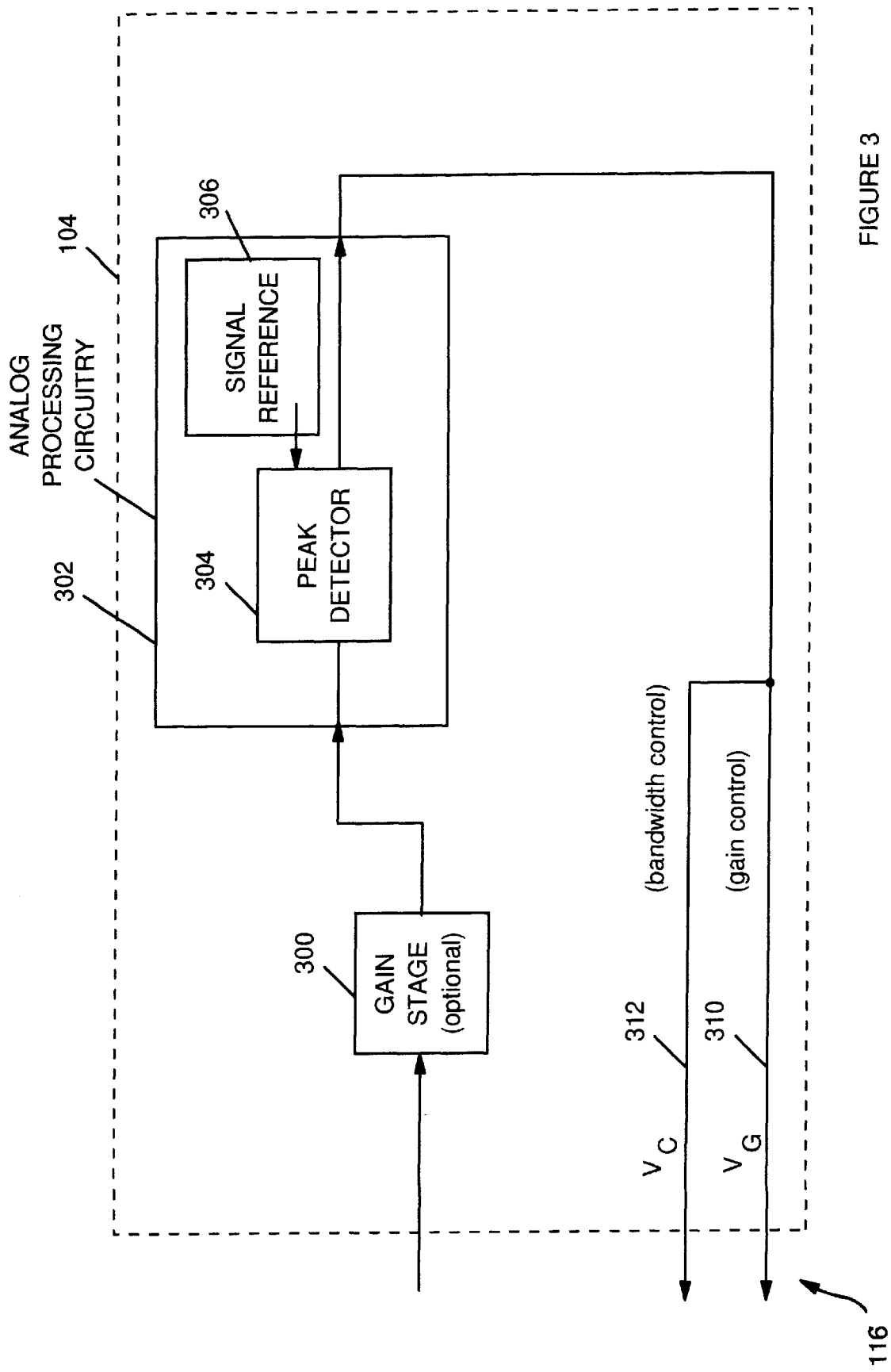
FIG. 3 is an analog implementation of signal processing circuitry shown in FIG. 1.

Now referring to FIG. 3, there is shown an analog implementation of the signal processing circuitry 104 shown in FIG. 1. The signal processing circuit 104 includes analog processing circuitry 302. Somewhat synonymous to the digital implementation, the gain processing circuitry 302 generates a single combined control signal 310, 312. The gain processing circuitry 302 includes a peak detector 304 and a signal reference 306. The gain processing circuitry 302 senses or analyzes amplitude of the received signal and compares it to the signal reference 306 to generate the feedback control signal 310, 312. When the peak detector 304 detects amplitude, the signal reference 306 typically includes a voltage reference More complex circuitry may be used whereby the peak detector 304 comprises an energy detector and the signal reference 306 includes a frequency and voltage reference. The signal 310, 312 adjust the transfer characteristics of the continuous-time filter 102. In addition, the signal processing circuitry 104 may include an optional gain stage 300 to provide amplification if desired.

The analog implementation of the signal processing circuitry 104, as shown in FIG. 3, is designed (with desired poles and zeros) to utilize a single control parameter for adjusting the transfer characteristics of the continuous-time filter 102, such as where low frequency gain does not vary significantly. As will be appreciated, an optional method of generating bandwidth control could include circuitry for filtering the received signal at different frequency ranges and comparing the filtered signals to generate an independent bandwidth control signal 312, that is separate from the gain control signal 310. Such an embodiment would require additional complex circuitry to perform the filtering and comparing function, if desired.

Figure 4:
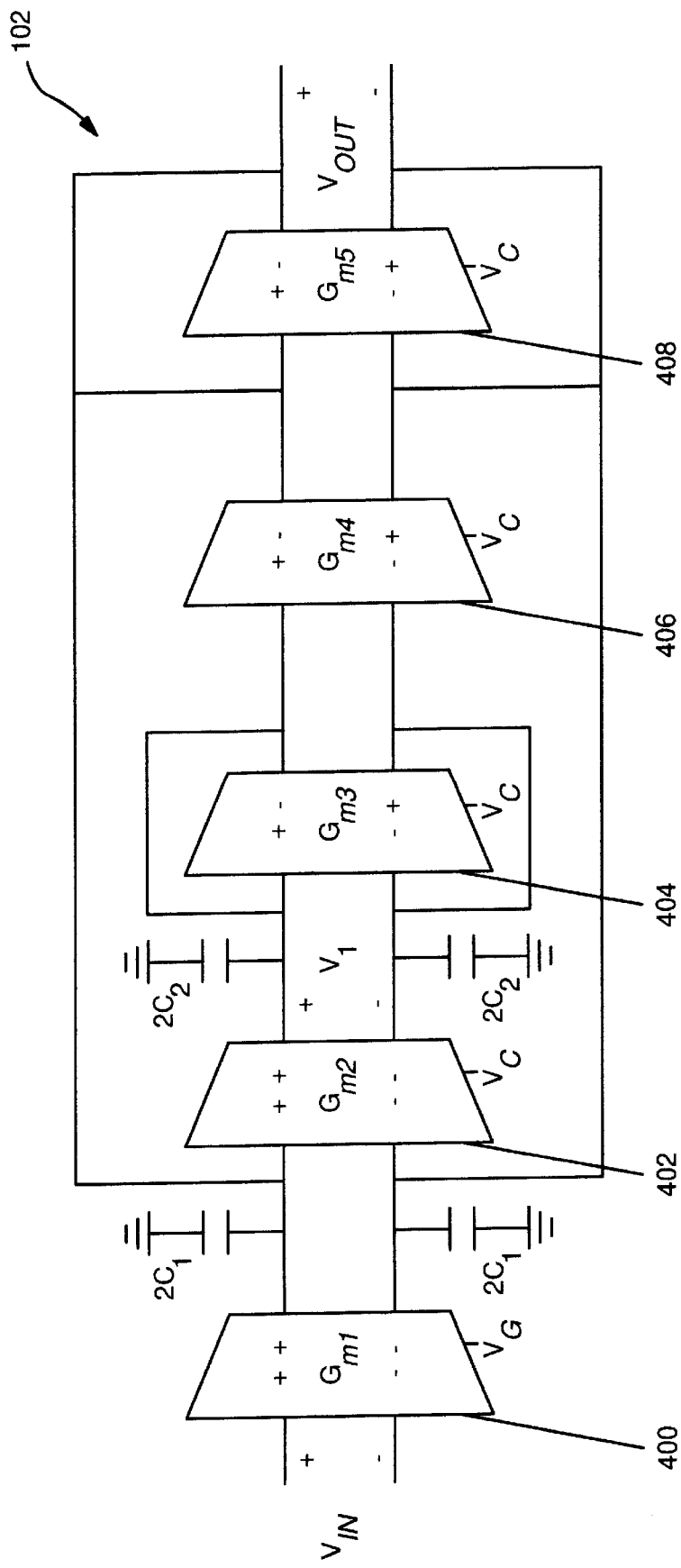
FIG. 4 illustrates a Gm-C implementation of a two-pole, one-zero continuous-time filter with variable bandwidth and gain to implement the adaptive cable equalizer.
Figure 5:
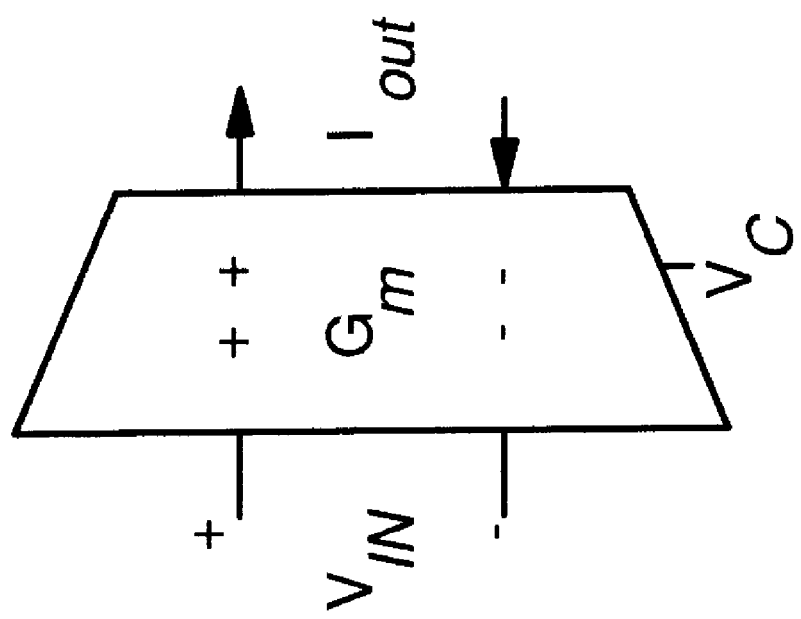
FIG. 5 is an illustration of a symbol for a fully differential transconductor.
Figure 6:
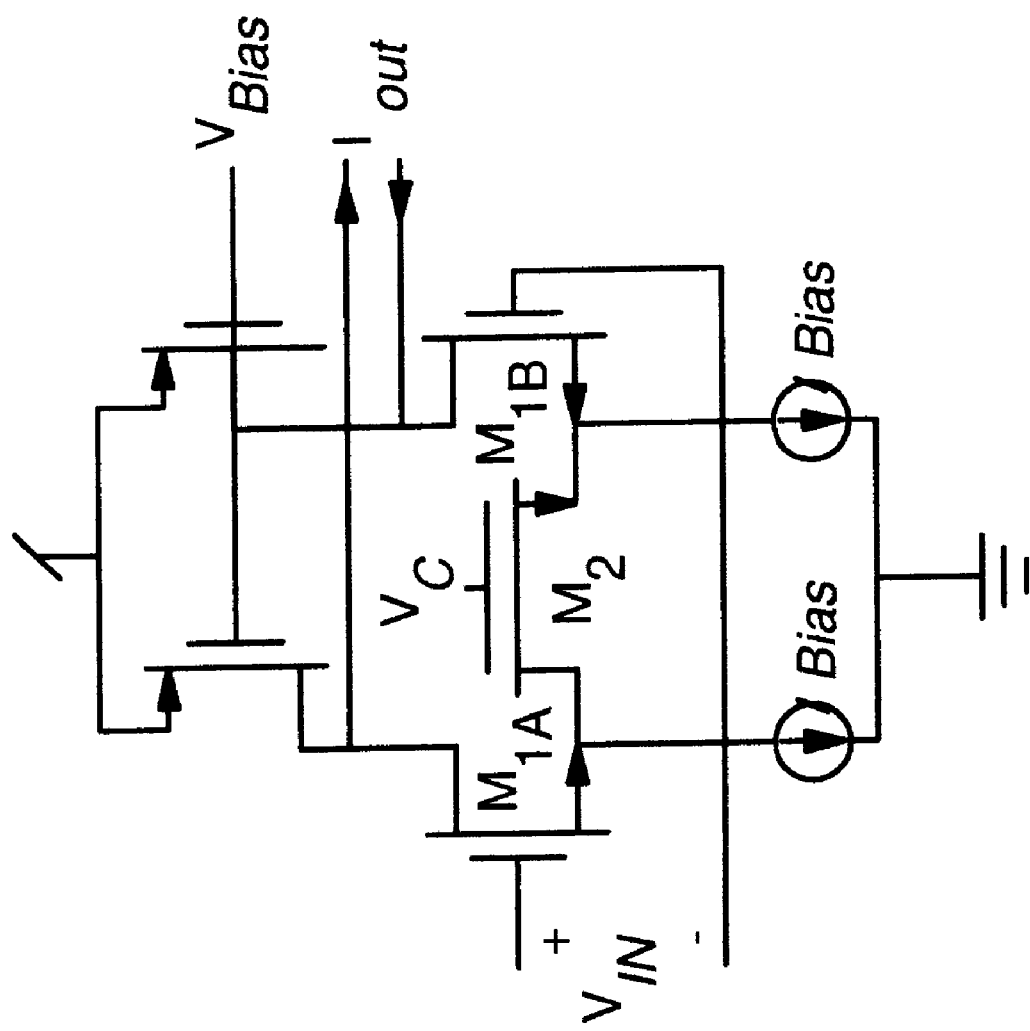
FIG. 6 illustrates a schematic diagram of a fully differential transconductor.

A popular method of implementing continuous-time filters is the Gm-C method, and FIGS. 4–6 illustrate the implementation of the continuous-time filter 102 using this method. Other methods for implementation may include active RC, MOSFET-C, etc. These and other types/methods may be used if they are better suited for the semiconductor process technology utilized and the bandwidth requirements for the desired application. The advantage of utilizing the Gm-C configured continuous-time filter 102 in the adaptive equalizer 100 is the relatively high bandwidths that can be achieved with these type of continuous-time filters. Now referring to FIG. 4, there is illustrated the continuous-time filter 102 designed using a plurality of fully differential transconductors 400, 402, 404, 406, 408 (FIG. 5 illustrates the symbol for a fully differential transconductor). Now referring to FIG. 6, there is illustrated a schematic diagram of a typical transconductor. The transconductor forms an integrator by forcing a current proportional to the input voltage onto a capacitor. The transconductance (Gm) of a transconductor can be varied with a control voltage $V_C$ (shown in FIG. 6).

Now referring back to FIG. 4, there is illustrated a two-parameter continuous-time filter 102 utilized to compensate for transmission medium 110 distortion and process variations. The illustrated filter 102 has two poles and one zero. As will be appreciated, the filter 102 may be designed to have any desired number of poles and zeros (i.e., transfer characteristics). By properly placing the relative positions of the poles and zeros of the equalizer 100, these poles and zeros can be scaled to compensate for both process tolerances and transmission medium channel variations. This method may also be used for higher order equalizers to equalize the channel more accurately, however only two parameters are needed to adjust the equalizer 100.

Prior art continuous-time filters typically require tuning or training to adjust for semiconductor process variations, and generally utilize either a master filter, a control loop whereby each pole or zero is controlled by an independent control signal, or a least mean square method to tune or train the continuous-time filter. The present invention provides a continuous-time filter having one or more poles and zeros. Utilization of a continuous-time filter in accordance with the present invention provides a filter with pole and zero locations in a fixed relation. Accordingly, only one control signal is required to scale the poles and zeros thereby adjusting the transfer characteristics of the continuous-time filter to compensate for distortion in the transmission channel and to compensate for semiconductor process variations. As such, all the pole and zero locations are shifted in a fixed relationship to change the filter transfer characteristics resulting in the ability to automatically compensate (or equalize) the received signal with respect to attenuation and bandwidth. The fixed ratio of the poles and zeros of the filter provide the capability not only to compensate for the channel distortion, but at the same time, compensate for semiconductor process variations that result in relatively high tolerances for elements of the continuous-time filter.

Shown in FIG. 4 is a grounded-capacitor implementation of a fully differential one zero and two pole continuous-time filter 102 of the equalizer 100. The transfer function for the equalizer 100 is:

$$H(s) = \frac{V_{OUT}(s)}{V_{IN}(s)} = \frac{G_{m1}(G_{m3} + sC_2)}{G_{m2}G_{m4} + (G_{m5} + sC_1)(G_{m3} + sC_2)} \quad (1)$$

The pole and zero locations for the equalizer 100 are:

$$z_1 = -G_{m3}/C_2 \quad (2)$$

$$P_{1,2} = \frac{-C_1 G_{m3} - C_2 G_{m5} \pm \sqrt{(C_2 G_{m5} + C_1 G_{m3})^2 - 4C_1 C_2(G_{m2}G_{m4} + G_{m3}G_{m5})}}{2C_1 C_2}$$

The frequency response of the equalizer 100 for $p_1$=7.2 MHz, $p_2$=230 MHz, and $z_1$=4.8 MHz is shown in FIG. 7.

Referring back to FIG. 4, the two control signals, $V_C$ and $V_G$, are used to set the bandwidth and gain, respectively, of the equalizer 100. The gain control signal $V_G$ is used to control $G_{m1}$, and the bandwidth control $V_C$ is used to control $G_{m2}$, $G_{m3}$, $G_{m4}$, and $G_{m5}$. A separate VGA is not necessary to control the gain. Higher order equalizers can be designed by cascading several of the equalizers shown in FIG. 4.

The transconductance of the transconductor shown in FIG. 6 in terms of the small signal parameters of the MOS transistors is:

$$G_m = \frac{1}{\frac{1}{g_{m1}} + R_{DS2}} \quad (3)$$

where:

$$g_{m1} = \sqrt{2k'\frac{W_1}{L_1}I_{BIAS}} \quad (4)$$

$$R_{DS2} = \frac{1}{k'\frac{W_2}{L_2}(V_C - V_S - V_{TH})}$$

Where $V_s$ is the source voltage of $M_1$ (transistors $M_{1A}$ and $M_{1B}$ shown in FIG. 2), and $V_{TH}$, k', W, and L are the threshold voltage, current gain, width and length of an N-channel FET, respectively. Since the circuit is fully differential, common-mode feedback (not shown) must be used to control $V_{BIAS}$ to force the output common-mode voltage to a voltage in the linear operating range of the transconductor.

Since the attenuation in most cables is dominated by the skin effect, the cable attenuation is proportional to the square root of frequency. This new solution takes advantage of this characteristic to simplify the complexity of the tuning system. The Laplace representation of a cable dominated by the skin effect can be expressed as:

$$H(\omega) = e^{-\alpha l\sqrt{s}} \quad (5)$$

where $\alpha$ is the attenuation constant for the cable, 1 is the length of the cable, and $s=j\omega$ is the Laplace operator. The equalizer 100 must compensate for this cable attenuation. Since the equalizer 100 is implemented using analog continuous-time techniques, the frequency response can be represented in the s domain using poles and zeros. The equalizer transfer function is:

$$H(s) = \frac{A\prod_{k=1}^{n}\left(1+\frac{s}{z_k}\right)}{\prod_{k=1}^{m}\left(1+\frac{s}{p_k}\right)} \quad (6)$$

Due to process variations, the location of the poles and zeros will vary by a large amount. However, since the matching of components on an integrated circuit chip is accurate, the ratio of any pole or zero to another pole or zero will be approximately constant. The process variations and the bandwidth control voltage can be included in the expression for the equalizer response:

$$H(s) = \frac{A\prod_{k=1}^{n}\left(1+\frac{s}{b(V_C - V_T)z_k}\right)}{\prod_{k=1}^{m}\left(1+\frac{s}{b(V_C - V_T)p_k}\right)} \quad (7)$$

where $V_C$ represents the bandwidth control voltage, and b (nominally 1) and $V_T$ are random variables that represent process variations, and $z_k$, $p_k$ are the nominal zero and pole locations. All of the pole and zero locations can be scaled linearly by scaling the transconductances $G_{m2}$–$G_{m5}$. Here it is assumed that $R_{DS2} \gg 1/g_{m1}$ for the transconductor. However, if this is not the case, the effect is to make transconductance a non-linear function of the bandwidth control voltage This effect will not affect the matching of ratioed transconductors as long as $W_1/L_1$, $W_2/L_2$, and $I_{BIAS}$ are all scaled by the same amount.

Since the equalizer 100 is compensating for both the process variations on the integrated circuit and the distortion caused by the cable, the required tuning range over which it must operate may be large. To avoid distortion in the signal path, transistor $M_2$ should remain in its linear (ohmic) region of operation over this range. This sets the lower limit of the transconductance. The bandwidth control $V_C$ is limited by the maximum output of the control circuitry. This may set the upper limit on the transconductance. Also, as the bandwidth control $V_C$ increases, the transconductance is no longer dominated by the resistance of $M_2$, the transconductances of the input devices ($g_{m1}$) start to be more significant (see Equation (3)). This has two effects on the preceding analysis. One is the distortion increases since $g_{m1}$ is more signal dependent than $R_{DS2}$. The second effect is the upper limit of the transconductance approaches $g_{m1}$ as the bandwidth control $V_C$ increases. This causes the transconductance to be a sub-linear function of bandwidth control $V_C$ thereby decreasing the tuning range when the bandwidth control $V_C$ is large. This problem can be alleviated by making the aspect ratio of the input devices $M_1$ much larger than the aspect ratio of $M_2$. However, increases in the size of $M_1$ can produce a zero in the integrator transfer function formed by the parasitic capacitance at the source node of the input pair. This can cause the phase of the integrator to deviate from 90° which can affect the filter transfer function.

Assume that $V_{MAX}$ is the maximum bandwidth control voltage allowable either due to distortion in the signal path or the maximum output voltage of the control circuitry. Also, assume that the minimum bandwidth control voltage is set so that $M_2$ is in the linear region to avoid distortion in the signal path. The bandwidth control voltage range is:

$$V_S + V_{TH} + V_{ipp}/4 < V_C < V_{MAX} \quad (8)$$

where $V_s$ is the source voltage of the input pair, $V_{TH}$ is the threshold voltage of the N-channel FET, and $V_{ipp}$ is the differential peak-to-peak input voltage of the transconductor. The tuning range of the transconductor is:

$$\text{Range} = \frac{\dfrac{1}{\sqrt{2k'\dfrac{W_1}{L_2}I_D}} + \dfrac{1}{k'\dfrac{W_2}{L_2}(V_{ipp}/4)}}{\dfrac{1}{\sqrt{2k'\dfrac{W_1}{L_2}I_D}} + \dfrac{1}{k'\dfrac{W_2}{L_2}(V_{MAX}-V_S-V_{TH})}} \quad (9)$$

This shows that as the amplitude of the input increases the tuning range decreases. Equation (9) is only an approximation of the range of the transconductor. Generally the range must be determined by simulation to account for all of the second order effects such as the transistor body effect.

The dynamic range of the filter is defined as the signal level at the output compared to the noise plus distortion levels at the output. There are several things that can be done to improve the dynamic range of the filter. One is to make the output common mode level more compatible with the input common mode level. This may require a level shift at the output or the input of the transconductor in FIG. 6. A folded cascade output will both level shift the common mode output level and increase the output impedance.

In the equation for the transfer function of the equalizer 100 there are seven independent variables. There are only four parameters to set for the equalizer 100: the gain, the two poles, and the zero. This means that the signal level $V_1$ at the internal node can be set independently of these. If this voltage is too large compared to the signal levels at the input and output, distortion will result. If the signal level is too small compared to the input and output, noise that couples into this node will become a problem. Dynamic range optimization will scale the transfer function from the input to this node for the optimal performance. The transfer function to this node is:

$$H(s) = \frac{V_1(s)}{V_{IN}(s)} = \frac{G_{m1}G_{m2}}{G_{m2}G_{m4}+(G_{m5}+sC_1)(G_{m3}+sC_2)} \quad (10)$$

The equalizer 100 is nominally designed to approximate the inverse of root-f cable when the cable is at a maximum length:

$$H(s) = \frac{A\prod_{k=1}^{n}\left(1+\dfrac{s}{(V_{clmax}-V_T)z_k}\right)}{\prod_{k=1}^{m}\left(1+\dfrac{s}{(V_{clmax}-V_T)p_k}\right)} \approx e^{\alpha l_{max}\sqrt{s}} \quad \omega \leq \omega_{max} \quad (11)$$

where $V_{clmax}$ is the bandwidth control voltage when the cable length is at a maximum and the process is nominal. It is only possible to approximate the exponential and this approximation is only valid over a finite frequency range $\omega \leq \omega_{max}$. Since biquadratic circuits are cascaded in FIG. 4 that have two poles and a zero, to approximate the inverse of root-f cable one of the poles must be at a frequency out of the frequency range of the data spectrum. Also, a more accurate representation can be achieved by cascading several of the circuits in FIG. 4. The nominal pole and zero locations in may be optimized using a curve fitting routine minimizing the magnitude of the error between the pole-zero response and inverse root-f attenuation.

By adjusting $V_C$, process variations can be compensated. For maximum cable length:

$$V_C = \frac{V_{clmax}-V_T}{b}+V_T \quad (12)$$

For other cable lengths, it is desired to have the equalizer 100 to have the transfer function:

$$H(s) = \frac{A\prod_{k=1}^{n}\left(1+\dfrac{s}{b(V_C-V_T)z_k}\right)}{\prod_{k=1}^{m}\left(1+\dfrac{s}{b(V_C-V_T)p_k}\right)} \approx e^{\alpha l\sqrt{s}} \quad (13)$$

By making a change of variables (the equivalent of scaling frequency) in the above of $s=s(l_{max}/l)^2$:

$$H(s(l_{max}/l)^2) = \frac{A\prod_{k=1}^{n}\left(1+\dfrac{s(l_{max}/l)^2}{b(V_C-V_T)z_k}\right)}{\prod_{k=1}^{m}\left(1+\dfrac{s(l_{max}/l)^2}{b(V_C-V_T)p_k}\right)} \approx e^{\alpha l_{max}\sqrt{s}} \quad (14)$$

Comparing equation (14) to equation (11), both pole-zero responses approximate the same exponential:

$$\frac{A\prod_{k=1}^{n}\left(1+\dfrac{s(l_{max}/l)^2}{b(V_C-V_T)z_k}\right)}{\prod_{k=1}^{n}\left(1+\dfrac{s(l_{max}/l)^2}{b(V_C-V_T)p_k}\right)} = \frac{A\prod_{k=1}^{n}\left(1+\dfrac{s}{(V_{clmax}-V_T)z_k}\right)}{\prod_{k=1}^{n}\left(1+\dfrac{s}{V_{clmax}-V_T)p_k}\right)} \approx e^{\alpha l_{max}\sqrt{s}} \quad (15)$$

From this, the equalizer 100 can approximate the inverse of various cable lengths and compensate for process tolerances by scaling the frequency of the transfer function. This frequency scaling can be accomplished by scaling all of the poles and zeroes of the equalizer by the same scale factor. This can be done by changing the bandwidth control $V_C$ of the equalizer 100. Setting the pole or zero locations to be the same in equation (15) and solving for the control voltage:

$$V_C = \frac{(V_{clmax}-V_T)(l_{max}/l)^2}{b}+V_T \quad (16)$$

From this, the bandwidth control $V_C$ can be adjusted to approximate the inverse of root-f cable for any cable length $l<l_{max}$. The bandwidth control $V_C$ will also be adjusted to compensate for the process variations b and $V_T$. The range of the control voltage is:

$$V_{TMIN} \leq V_C \leq \frac{(V_{clmax}-V_T)(l_{max}/l)^2}{b_{MIN}}+V_{TMAX} \quad (17)$$

where $V_{TMIN}$ and $V_{TMAX}$ are the minimum and maximum values of $V_T$, and $b_{TMIN}$ and $b_{TMAX}$ are the minimum and maximum values of b.

It will be understood by those skilled in the art that there are several adaptive algorithms used to compute the bandwidth control $V_G$ for optimal equalization. One of these uses a two-parameter equalization system for metallic cables. It minimizes the autocorrelation of the received data for baseband channels. It also uses the amplitude of the signal to set the gain parameter. This method is effective since the autocorrelation is independent of the amplitude of the signal making it possible to optimize the gain and the frequency response of the channel independently without training. The continuous-time filter 102 in FIG. 4 can implement these algorithms since it allows for bandwidth control $V_C$ and gain control $V_G$.

It will be appreciated that many various ways and means may be designed to provide the functions of the signal processing circuitry 104, and as such, the use of any type of hardware and/or software is not intended to limit in any way the present invention.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. An adaptive equalizer comprising:
    an integrated continuous-time filter fabricated on a substrate for receiving and filtering an input signal from a cable and generating an output signal, the output signal being an equalized version of the input signal; and
    circuitry for processing the output signal and generating a control signal for feedback to the integrated continuous-time filter, the control signal controlling transfer characteristics of the integrated continuous-time filter such that distortion in the input signal from the cable is compensated wherein the control signal comprises:
        a bandwidth control signal for controlling the bandwidth of the integrated continuous-time filter; and
        a gain control signal for controlling the gain of the integrated continuous-time filter.

2. The equalizer in accordance with claim 1 wherein the circuitry for processing is fabricated on the substrate.

3. The equalizer in accordance with claim 1 wherein semiconductor process variations in the integrated continuous-time filter are compensated.

4. The equalizer in accordance with claim 3 wherein the circuitry for processing is fabricated on the substrate.

5. The equalizer in accordance with claim 3 wherein the equalizer is a higher order equalizer whereby the transfer characteristics of the continuous-time filter includes at least two poles and two zeros.

6. An adaptive equalizer comprising:
    an integrated continuous-time filter fabricated on a substrate for receiving and filtering an input signal from a cable and generating an output signal, the output signal being an equalized version of the input signal; and
    circuitry for processing the output signal and generating a control signal for feedback to the integrated continuous-time filter, the control signal controlling transfer characteristics of the integrated continuous-time filter such that distortion in the input signal from the cable is compensated wherein the circuitry for processing comprises analog signal processing circuitry for generating the control signal in response to a comparison between amplitude characteristics of the output signal of the integrated continuous-time filter and ideal amplitude characteristics of the input signal.

7. The equalizer in accordance with claim 6 wherein the analog signal processing circuitry comprises a peak detector.

8. An adaptive equalizer comprising:
    an integrated continuous-time filter fabricated on a substrate for receiving and filtering an input signal from a cable and generating an output signal, the output signal being an equalized version of the input signal; and
    circuitry for processing the output signal and generating a control signal for feedback to the integrated continuous-time filter, the control signal controlling transfer characteristics of the integrated continuous-time filter such that distortion in the input signal from the cable is compensated wherein the circuitry for processing comprises digital signal processing circuitry for generating the control signal in response to a comparison between frequency and amplitude characteristics of the output signal of the integrated continuous-time filter and ideal frequency and amplitude characteristics of the input signal.

9. The equalizer in accordance with claim 8 wherein the control signal comprises:
    a bandwidth control signal for controlling the bandwidth of the integrated continuous-time filter; and
    a gain control signal for controlling the gain of the integrated continuous-time filter.

10. The equalizer in accordance with claim 9 wherein the digital signal processing circuitry comprises:
    an analog-to-digital converter for converting the output signal into a digital output signal;
    circuitry means for processing the digital output signal using an autocorrelation algorithm and generating a digital bandwidth control signal and a digital gain control signal;
    a first digital-to-analog converter for converting the digital bandwidth control signal into the bandwidth control signal for input to the integrated continuous-time filter; and
    a second digital-to-analog converter for converting the digital gain control signal into the gain control for input to the integrated continuous-time filter.

11. An adaptive equalizer comprising:
    an integrated continuous-time filter fabricated on a substrate for receiving and filtering an input signal from a cable and generating an output signal, the output signal being an equalized version of the input signal; and
    circuitry for processing the output signal and generating a control signal for feedback to the integrated continuous-time filter, the control signal controlling transfer characteristics of the integrated continuous-time filter, such that distortion in the input signal from the cable is compensated wherein semiconductor process variations in the integrated continuous-time filter are compensated wherein the circuitry for processing comprises analog signal processing circuitry for generating the control signal in response to a comparison between amplitude characteristics of the output signal of the integrated continuous-time filter and ideal amplitude characteristics of the input signal.

12. The equalizer in accordance with claim 11 wherein the analog signal processing circuitry comprises a peak detector.

13. An adaptive equalizer comprising:
    an integrated continuous-time filter fabricated on a substrate for receiving and filtering an input signal from a cable and generating an output signal, the output signal being an equalized version of the input signal; and
    circuitry for processing the output signal and generating a control signal for feedback to the integrated continuous-time filter, the control signal controlling transfer characteristics of the integrated continuous-time filter such that distortion in the input signal from the cable is compensated wherein semiconductor process variations in the integrated continuous-time filter are compensated wherein the circuitry for processing comprises digital signal processing circuitry for generating the control signal in response to a comparison between frequency and amplitude characteristics of the output signal of the integrated continuous-time filter and ideal frequency and amplitude characteristics of the input signal.

14. The equalizer in accordance with claim 13 wherein the control signal comprises:

a bandwidth control signal for controlling the bandwidth of the integrated continuous-time filter; and a gain control signal for controlling the gain of the integrated continuous-time filter.

15. The equalizer in accordance with claim 14 wherein the digital signal processing circuitry comprises:

an analog-to-digital converter for converting the output signal into a digital output signal;

circuitry means for processing the digital output signal using an autocorrelation algorithm and generating a digital bandwidth control signal and a digital gain control signal;

a first digital-to-analog converter for converting the digital bandwidth control signal into the bandwidth control signal for input to the integrated continuous-time filter; and a second digital-to-analog converter for converting the digital gain control signal into the gain control for input to the integrated continuous-time filter.

16. An adaptive cable equalizer comprising:

an integrated continuous-time filter fabricated on a substrate receiving and filtering an input signal from a cable and generating an output signal, the output signal being an equalized version of the input signal; and circuitry, coupled to the integrated continuous-time filter in a feedback loop, for processing the output signal and generating a gain control signal and a bandwidth control signal for feedback to the integrated continuous-time filter, the gain control signal and the bandwidth control signal adjusting the transfer characteristics of the integrated continuous-time filter thereby compensating for loss and distortion of the input signal caused by the cable and tuning the integrated continuous-time filter to compensate for semiconductor process variations in the integrated continuous-time filter.

17. The adaptive cable equalizer in accordance with claim 16 wherein the continuous-time filter comprises a plurality of transconductors implemented in a transconductance-capacitor configuration.

18. The adaptive cable equalizer in accordance with claim 17 wherein the transconductance of the plurality of transconductors adjusted in response to the gain control signal and the bandwidth control signal.

19. The adaptive cable equalizer in accordance with claim 16 wherein the continuous-time filter comprises:

a first transconductor coupled to the gain control signal, the gain control signal controlling the gain of the integrated continuous-time filter; and a second transconductor coupled to the bandwidth control signal, the bandwidth control signal controlling the bandwidth of the integrated continuous-time filter.

20. The adaptive cable equalizer in accordance with claim 19 wherein the circuitry for processing comprises digital signal processing circuitry for generating the gain control signal and the bandwidth control signal in response to minimizing an autocorrelation of the input signal.

21. The adaptive cable equalizer in accordance with claim 20 wherein the digital signal processing circuitry comprises:

an analog-to-digital converter for converting the output signal into a digital output signal;

circuitry means for processing the digital output signal using an autocorrelation algorithm and generating a digital bandwidth control signal and a digital gain control signal;

a first digital-to-analog converter for converting the digital bandwidth control signal into the bandwidth control signal for input to the integrated continuous-time filter; and a second digital-to-analog converter for converting the digital gain control signal into the gain control for input to the integrated continuous-time filter.

22. The adaptive cable equalizer in accordance with claim 19 wherein the circuitry for processing comprises analog signal processing circuitry for generating the gain control signal and the bandwidth control signal in response to a comparison between amplitude characteristics of the output signal of the integrated continuous-time filter and ideal amplitude characteristics of the input signal.

23. The adaptive cable equalizer in accordance with claim 22 wherein the analog signal processing circuitry comprises a peak detector.

24. The adaptive cable equalizer in accordance with claim 16 wherein the circuitry for processing is fabricated on the substrate and the integrated continuous-time filter and the circuitry for processing are fabricated using CMOS technology.

25. The adaptive cable equalizer in accordance with claim 16 wherein the continuous-time filter includes at least one pole location and at least one zero location and the control signal shifts the at least one pole location and the at least one zero location thereby controlling the transfer characteristics of the continuous-time filter.

26. A method for compensating for distortion of a signal caused by the transmission of the signal through a transmission medium, comprising the steps of:

receiving the signal;

performing an adaptive algorithm on the received signal using one or more known parameters of the received signal;

generating a control signal in response to the performance of the adaptive algorithm;

feeding back the control signal to an integrated continuous-time filter; and filtering the received signal with the integrated continuous-time filter to generate an equalized signal, wherein the control signal comprises a gain control signal for adjusting gain of the integrated continuous-time filter and a bandwidth control signal for adjusting bandwidth of the integrated continuous-time filter.

27. The method in accordance with claim 26 wherein the performance of the adaptive algorithm minimizes an autocorrelation of the received signal.

28. The method in accordance with claim 26 further including the step of compensating for semiconductor process variations.

* * * * *